(12) United States Patent
Yanagida

(10) Patent No.: US 10,163,775 B2
(45) Date of Patent: Dec. 25, 2018

(54) ELECTRONIC DEVICE

(71) Applicant: ROHM CO., LTD., Kyoto (JP)

(72) Inventor: Hideaki Yanagida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 254 days.

(21) Appl. No.: 15/044,878

(22) Filed: Feb. 16, 2016

(65) Prior Publication Data

US 2016/0242294 A1    Aug. 18, 2016

(30) Foreign Application Priority Data

Feb. 18, 2015 (JP) ................. 2015-029628

(51) Int. Cl.
    *H05K 1/18* (2006.01)
    *H01L 23/498* (2006.01)
    *H01L 23/13* (2006.01)
    *H01L 23/14* (2006.01)
    (Continued)

(52) U.S. Cl.
    CPC ...... *H01L 23/49872* (2013.01); *H01L 21/486* (2013.01); *H01L 23/13* (2013.01); *H01L 23/147* (2013.01); *H01L 23/49827* (2013.01); *H01L 23/3121* (2013.01); *H01L 2224/16235* (2013.01); *H01L 2924/15156* (2013.01); *H01L 2924/15313* (2013.01)

(58) Field of Classification Search
    CPC ......... H01L 33/44; H01L 33/62; H01L 33/60; H01L 33/641–33/642
    USPC ..... 361/760–764, 767, 782–784; 257/98–99, 257/690, 787–790
    See application file for complete search history.

(56) References Cited

U.S. PATENT DOCUMENTS 7,138,710 B2 * 11/2006 Fukazawa ............. H01L 23/481
                                                         257/686
7,741,772 B2 *  6/2010 Lin ..................... H01L 25/0753
                                                         313/500
(Continued)

FOREIGN PATENT DOCUMENTS

JP          2012-99673          5/2012

*Primary Examiner* — Tuan T Dinh
(74) *Attorney, Agent, or Firm* — Hamre, Schumann, Mueller & Larson, P.C.

(57) ABSTRACT

The present disclosure provides an electronic device suitable for miniaturization. The present electronic device includes: a substrate (1), having a main surface (111) and a back surface (112) facing opposite sides with each other in a thickness direction, wherein the substrate comprises a semiconductor material; an electronic component (8), which is disposed over the substrate (1); and a conductive layer (3), which is electrically connected with the electronic component (8); wherein a recess for disposing the component (14) and a through recess (17) are formed in the substrate, in which recess for disposing the component (14) is recessed from the main surface (111), and the through recess (17) penetrates from the recess for disposing the component (14) to the back surface (112); the electronic component (8) is disposed over the recess for disposing the component (14); a metal-filled portion (4) is formed in the through recess (17), wherein the metal-filled portion blocks at least the bottom of the through recess (17) and is filled with a metal material; and the conductive layer (3) is formed at least from the through recess (17) to the back surface (112).

22 Claims, 17 Drawing Sheets

(51) Int. Cl.
*H01L 21/48* (2006.01)
*H01L 23/31* (2006.01)

(56) References Cited

U.S. PATENT DOCUMENTS

| | | | |
|---|---|---|---|
| 7,981,798 B2 * | 7/2011 | Taguchi | H01L 24/97 |
| | | | 257/E21.249 |
| 9,698,563 B2 * | 7/2017 | Palaniswamy | H01L 33/486 |
| 2007/0090510 A1 * | 4/2007 | Tseng | H01L 33/641 |
| | | | 257/690 |
| 2007/0187706 A1 * | 8/2007 | Higashi | H01L 33/60 |
| | | | 257/98 |
| 2007/0235739 A1 * | 10/2007 | Sun | H01L 33/642 |
| | | | 257/79 |
| 2008/0191227 A1 * | 8/2008 | Kimura | H01L 33/62 |
| | | | 257/98 |
| 2009/0121249 A1 * | 5/2009 | Tseng | H01L 33/44 |
| | | | 257/98 |
| 2010/0117113 A1 * | 5/2010 | Lu | F21K 9/00 |
| | | | 257/99 |
| 2010/0207152 A1 * | 8/2010 | Won | H01L 25/167 |
| | | | 257/98 |

* cited by examiner

ELECTRONIC DEVICE

BACKGROUND

The present disclosure is related to an electronic device.

Various forms of electronic devices that perform a specific function to the current inputted from or outputted to an external source have been disclosed. Generally, in order to allow the electronic device to exhibit the desired functionality, various components respectively constituting a portion of the circuit are disposed therein. The metal leads are used for the purposes of supporting components and establishing the interconnection thereof. The number, shape and dimension of the leads are determined depending on the functionality, shape and dimension of these components. Said components mounted on the leads are covered by a sealing resin. The sealing resin is configured to protect a portion of the leads and the components. Such electronic device is installed on the circuit substrate of electronic machines. With the advancement of the technology, the demand for the miniaturization of electronic devices has increased. Further, regarding the prior technical literature, patent literature 1 listed below is provided as an example.

PRIOR TECHNICAL LITERATURE

Patent Literature

[Patent literature 1] Japanese patent laid-open publication No. 2012-99673.

BRIEF SUMMARY OF THE INVENTION

Problems to be Solved in the Present Invention

The present disclosure is conceived in view of the foregoing situation, and a main purpose thereof is to provide an electronic device suitable for miniaturization.

Technical Means for Solving Problems

According to the present disclosure, an electronic device provided herein comprises: a substrate, having a main surface and a back surface facing opposite sides with each other in a thickness direction, and comprises a semiconductor material; an electronic component, disposed over the substrate; and a conductive layer, electrically connected with the electronic component; wherein, a recess for disposing the component and a through recess are formed in the substrate, in which the recess for disposing the component is recessed from the main surface, and the through recess penetrates from the recess for disposing the component to the back surface; the electronic component is disposed over the recess for disposing the component; a metal-filled portion is formed in the through recess, wherein the metal-filled portion blocks at least a bottom of the through recess and is filled with a metal material; and the conductive layer is formed at least from the through recess to the back surface.

In the preferred embodiments of the present disclosure, the through recess comprises an opening at the bottom, wherein the opening is flat and faces the thickness direction, and the metal-filled portion blocks the entirety of the opening.

In the preferred embodiments of the present disclosure, the metal-filled portion comprises an end surface facing the same direction as the back surface, and the end surface is coplanar with the back surface.

In the preferred embodiments of the present disclosure, the conductive layer comprises a covering portion that covers the end surface of the metal-filled portion.

In the preferred embodiments of the present disclosure, a dimension of the metal-filled portion in the thickness direction is greater than the thickness of the conductive layer.

In the preferred embodiments of the present disclosure, a first insulating film formed under the back surface of the substrate is further comprised, and the first insulating film is between the substrate and the conductive layer.

In the preferred embodiments of the present disclosure, the first insulating film is formed by laminating insulating materials.

In the preferred embodiments of the present disclosure, the first insulating film comprises a polyimide resin or a benzocyclobutene resin.

In the preferred embodiments of the present disclosure, a second insulating film formed under the back surface is further comprised, and the conductive layer is between the first insulating film and the second insulating film.

In the preferred embodiments of the present disclosure, a backside electrode pad formed under the back surface is further comprised, wherein the backside electrode pad is connected with the conductive layer and electrically connected with the electronic component.

In the preferred embodiments of the present disclosure, a cross-sectional dimension of the through recess decreases from the main surface side toward the back surface side.

In the preferred embodiments of the present disclosure, the recess for disposing the component has a bottom surface facing a first thickness direction, which is one side of the thickness direction, and the electronic component is disposed over the bottom surface of the recess for disposing the component.

In the preferred embodiments of the present disclosure, the bottom surface of the recess for disposing the component is a plane orthogonal to the thickness direction.

In the preferred embodiments of the present disclosure, the number of the through recess is plural.

In the preferred embodiments of the present disclosure, the conductive layer comprises: a plurality of bonding pads, configured to dispose the electronic component; a plurality of backside pads, formed under the back surface side; and a plurality of through recess inner conductive part, for respectively electrically connecting the plurality of bonding pads and the plurality of backside pads, and respectively formed within a plurality of the through recess.

In the preferred embodiments of the present disclosure, each of the plurality of bonding pads, when viewed in the thickness direction, has at least a portion thereof overlapping with any one of the plurality of the through recesses.

In the preferred embodiments of the present disclosure, the conductive layer is formed from the recess for disposing the component via the through recess to across the back surface.

In the preferred embodiments of the present disclosure, the bonding pads are formed over the recess for disposing the component.

In the preferred embodiments of the present disclosure, the conductive layer comprises a seed layer and a plating layer, wherein the seed layer is between the substrate and the plating layer.

In the preferred embodiments of the present disclosure, a sealing resin portion filled in the recess for disposing the component and covering the electronic component is further comprised.

In the preferred embodiments of the present disclosure, the substrate comprises mono crystalline of a semiconductor material.

In the preferred embodiments of the present disclosure, the semiconductor material is silicon (Si).

In the preferred embodiments of the present disclosure, the main surface and the back surface are orthogonal to the thickness direction and have a flat shape.

In the preferred embodiments of the present disclosure, the main surface is a (100) plane.

Other features and advantages of the present disclosure will be more readily understood in light of the following detailed description in connection with the appended drawings.

DETAILED DESCRIPTION

The preferred embodiments of the present disclosure are specifically discussed below by referencing to the drawings.

Figure 1:
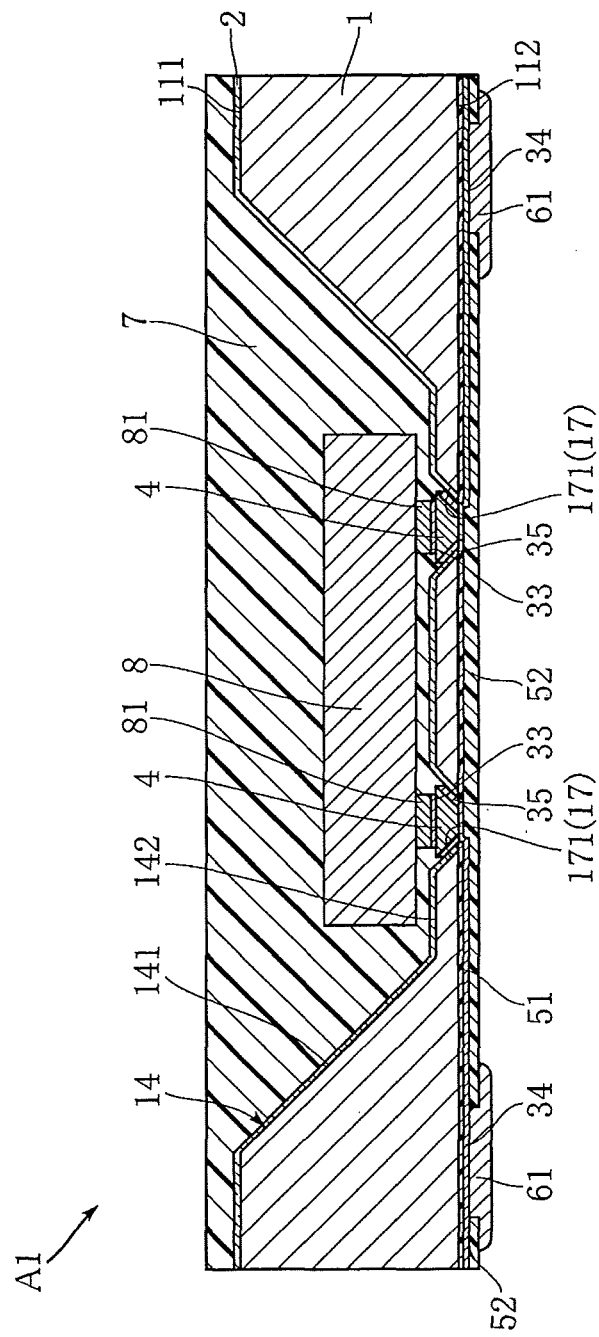
FIG. 1 is a sectional view illustrating an electronic device according to a first embodiment of the present disclosure.
Figure 2:
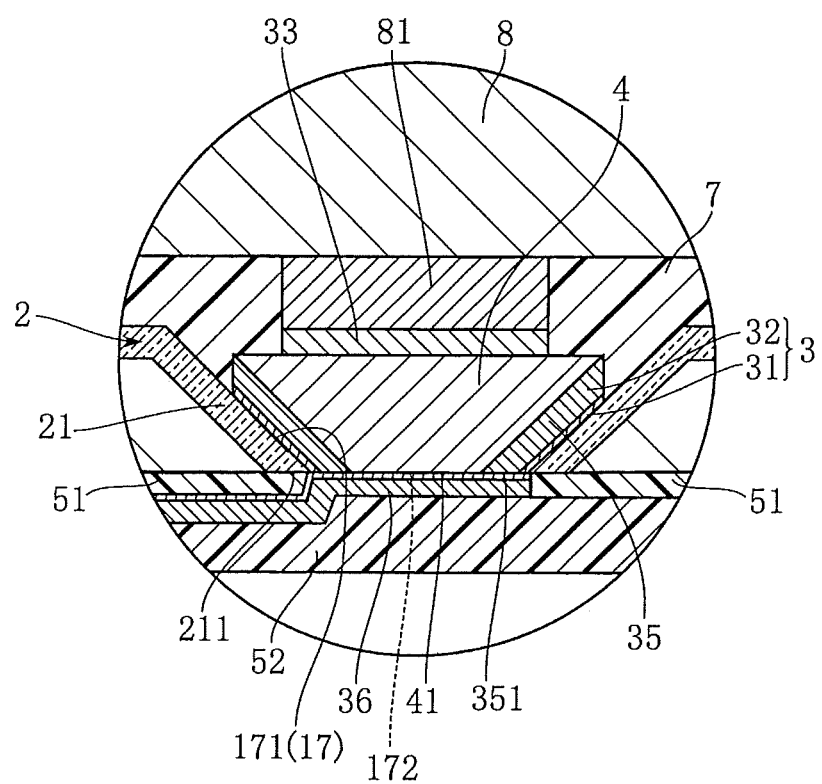
FIG. 2 is an enlarged sectional view of the main portion of the electronic device of FIG. 1.
Figure 3:
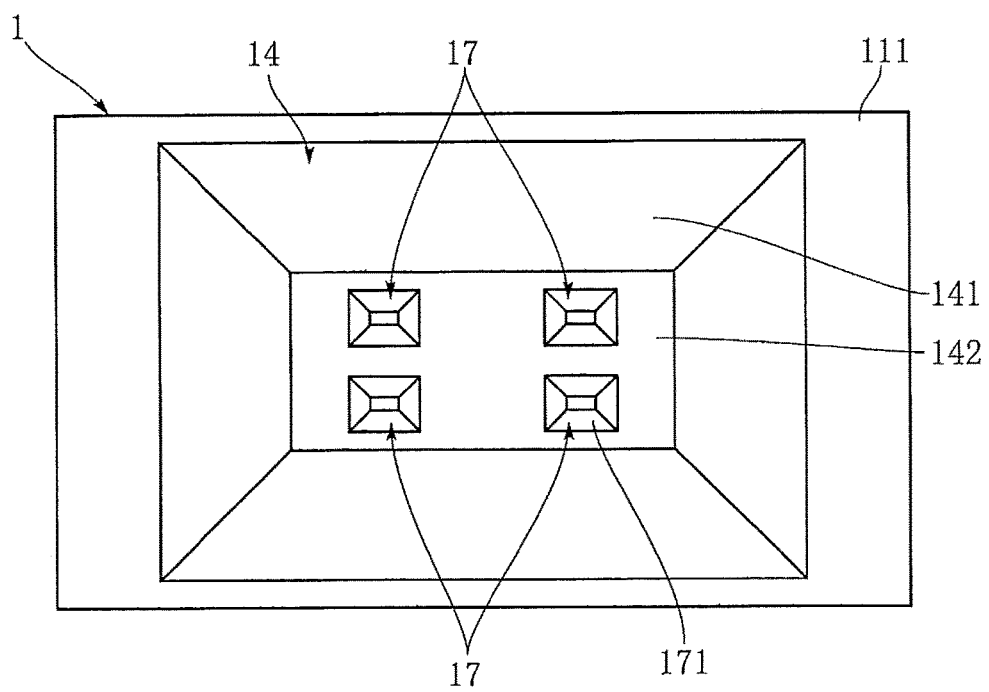
FIG. 3 is a top view illustrating the substrate of the electronic device of FIG. 1.

FIG. 1 and FIG. 2 illustrate an electronic device according to the first embodiment of the present disclosure. The electronic device A1 of this embodiment comprises a substrate 1, an insulating layer 2, a conductive layer 3, a metal-filled portion 4, insulating films 51 and 52, backside electrode pads 61, a sealing resin portion 7, and an electronic component 8. FIG. 1 is a sectional view taken along the cross-section of the electronic device A1 in the thickness direction. FIG. 2 is an enlarged sectional view illustrating a main portion of the electronic device A1. Also, FIG. 3 only illustrates the top view of the substrate 1.

The substrate 1 comprises monocrystalline of a semiconductor material. In this embodiment, the substrate 1 comprises monocrystalline silicon. The material of the substrate 1 is not limited to silicon (Si); for example, it can also be SiC. The thickness of the substrate 1 is, for example, 200 to 550 μm. The electronic component 8 is disposed over the substrate 1.

The substrate 1 has a main surface 111 and a back surface 112.

The main surface 111 faces one side in the thickness direction. The main surface 111 is flat. The main surface 111 is orthogonal to the thickness direction. The main surface 111 can be the (100) plane or (100) plane. In this embodiment, the main surface 111 is the (100) plane.

The back surface 112 faces the other side in the thickness direction. That is, the back surface 112 and the main surface 111 face opposite sides to each other. The back surface 112 is flat. The back surface 112 is orthogonal to the thickness direction.

A recess for disposing the component 14 and a plurality of through recesses 17 are formed in the substrate 1.

The recess for disposing the component 14 is recessed from the main surface 111. The electronic component 8 is disposed over the recess for disposing the component 14. The depth of the recess for disposing the component 14 (the dimension of the distance between the main surface 111 and the bottom surface 142 (described below) of the recess for disposing the component in the thickness direction) is, for example, 100 to 300 μm. The recess for disposing the component 14, when viewed in the thickness direction, has a rectangular shape. The shape of the recess for disposing the component 14 depends on the (100) plane for use as the main surface 111.

The recess for disposing the component 14 comprises a lateral surface 141 and the bottom surface 142.

The bottom surface 142 faces the same side as the main surface 111 in the thickness direction of the substrate 1. The bottom surface 142, when viewed in the thickness direction, has a rectangular shape. The electronic component 8 is disposed over the bottom surface 142. The bottom surface 142 is a plane orthogonal to the thickness direction.

The lateral surface 141 is connected with the bottom surface 142. The lateral surface 141 is slanted with respect to the thickness direction. The lateral surface 141 forms an included angle of 55 degrees with the plane that is orthogonal to the thickness direction. The reason for this is because the (100) plane is used as the main surface 111. The lateral surface 141 has four flat faces.

The through recess 17 is recessed from the recess for disposing the component 14 toward the back surface 112 side, so that a portion of the substrate 1 is penetrated through from the bottom surface 142 to the back surface 112. In this embodiment, the number of the through recess 17 is a multiple (such as, four), including two through recesses 17 shown in the sectional view of FIG. 1, and two through recesses 17 disposed at positions perpendicular to the paper plane of FIG. 1 and spaced by a specific distance (please refer to FIG. 3). The depth of the through recess 17 is, for example, 10 to 50 μm. When viewed from the thickness direction of the substrate 1, the maximum opening dimension of the through recess 17 is, for example, 10 to 50 μm. When viewed from the thickness direction of the substrate 1, the ratio of the depth of the through recess 17 to the maximum opening dimension of the through recess 17 is, for example, 0.2 to 5. In this embodiment, the through recess 17, when viewed in the thickness direction, has a rectangular shape. Also, in this embodiment, the cross-sectional dimension of the through recess 17 decreases from the main surface 111 side toward the back surface 112 side in the thickness direction.

The through recess 17 comprises a through recess inner surface 171. The through recess inner surface 171 is slanted with respect to the thickness direction of the substrate 1. The through recess inner surface 171 has four flat faces. In this embodiment, the through recess inner surface 171 is connected with the bottom surface 142 and the back surface 112. The through recess inner surface 171 forms an included angle of 55 degrees with respect to the plane that is orthogonal to the thickness direction. The reason for this is because the (100) plane is used as the main surface 111. In this embodiment, in the bottom of the through recess 17, a flat opening 172 facing the thickness direction of the substrate 1 is formed.

An insulating layer 2 is formed on the substrate 1. The insulating layer 2 covers the portions of the substrate 1 that face the side opposite to the back surface 112. More specifically, the insulating layer 2 covers the main surface 111, the lateral surface 141, the bottom surface 142, and the through recess inner surface 171. The thickness of the insulating layer 2 is, for example, about 0.1 to 1.0 μm. The insulating layer 2 comprises $SiO_2$. The insulating layer 2 is formed by, for example, thermal oxidation.

The insulating layer 2 comprises a through recess inner surface insulated part 21. The through recess inner surface insulated part 21 is formed on the through recess inner surface 171 of the through recess 17. The through recess inner surface insulated part 21 comprises an end surface 211 facing a direction that is the same as the back surface 112. The end surface 211 and the back surface 112 are coplanar.

A conductive layer 3 is electronically connected with the electronic component 8. The conductive layer 3 is configured to constitute the electric current path for inputting and outputting the current into and from the electronic component 8. The conductive layer 3 extends at least from the through recess 17 (the through recess inner surface 171) to the back surface 112. In this embodiment, the conductive layer 3 is formed on the through recess 17 (the through recess inner surface 171) and the back surface 112.

The conductive layer 3 comprises, for example, a seed layer 31 and a plating layer 32.

The seed layer 31 is acting as a base layer used for forming the required plating layer 32. The seed layer 31 is between the substrate 1 and the plating layer 32. The seed layer 31 comprises, for example, Ti or Cu, or the like. The seed layer 31 is formed, for example, by sputtering. The thickness of the seed layer 31 is, for example, less than 1 μm.

The plating layer 32 is formed by performing the electroplating plating using the seed layer 31. The plating layer 32 comprises layers formed by laminating, for example, Cu, or Ti, Ni and Cu, or the like. The thickness of the plating layer 32 is, for example, about 3 to 10 μm. The thickness of the plating layer 32 is thicker than the thickness of the seed layer 31.

The conductive layer 3 comprises a bonding pad 33, a backside pad 34, a through recess inner conductive part 35, and a covering portion 36.

The bonding pad 33 is disposed over at least one of the recess for disposing the component 14 and through recess 17. The bonding pad 33 is configured to dispose the electronic component 8 over the recess for disposing the component 14. In this embodiment, the bonding pad 33 is formed on the metal-filled portion 4 described below. Further, in this embodiment, a plurality of bonding pads 33 are disposed correspondingly to a plurality of through recesses 17. Each bonding pad 33, when viewed in the thickness direction of the substrate 1, overlaps with any one of the through recesses 17. Moreover, in embodiments different from the one illustrated in FIG. 1, it is feasible to configure the device without disposing the bonding pad 33. In the case where no bonding pad 33 is disposed, for example, the electronic component 8 is mounted on the metal-filled portion 4 via the solder 81 (as described below).

The backside pad 34 is formed under the back surface 112. The backside pad 34 is configured to be a portion used as the base for forming the backside electrode pad 61 described below. In this embodiment, a plurality of backside pads 34 are disposed correspondingly to a plurality of through recesses 17.

The through recess inner conductive part 35 comprises a portion formed on the through recess inner surface 171 of the through recess 17. In this embodiment, as illustrated in FIG. 2, the through recess inner conductive part 35 is laminated on the through recess inner surface insulated part 21 of the insulating layer 2. The through recess inner conductive part 35 comprises an end surface 351 facing the direction that is the same as the back surface 112. The end surface 351 and the back surface 112 are coplanar.

The covering portion 36 is formed at the back surface 112 side of the substrate 1. The covering portion 36 is electrically connected with the backside pad 34. In this embodiment, the covering portion 36 covers the below-mentioned end surface 41 of the metal-filled portion 4 and the end surface 351 of the through recess inner conductive part 35.

The through recess inner conductive part 35 is electrically connected with the bonding pad 33, which is formed on the metal-filled portion 4 and with the backside pad 34, which is formed under the back surface 112.

The metal-filled portion 4 is disposed in the through recess 17. The metal-filled portion 4 comprises, for example, a metal material with an excellent conductive property such as Cu or the like. The metal-filled portion 4 is filled in at least a portion of the through recess 17. The metal-filled portion 4 covers at least a bottom of the through recess 17. In this embodiment, the metal-filled portion 4 blocks the entirety of the opening 172 at the bottom of the through recess 17. In this embodiment, the metal-filled portion 4 covers at least a portion of the through recess inner conductive part 35. The metal-filled portion 4 comprises an end surface 41 facing a direction that is the same as the back surface 112. The end surface 41 of the metal-filled portion 4 and the back surface 112 of the substrate 1 are coplanar. The dimension of the metal-filled portion 4 in the thickness direction of the substrate 1 is greater than the thickness of the conductive layer 3. The ratio of the dimension of the metal-filled portion 4 in the thickness direction to the depth of the through recess 17 is, for example, 0.2 to 0.8.

The insulating film 51 is formed on the back surface 112. The insulating film 51 is between the substrate 1 and the conductive layer 3. In this embodiment, the insulating film 51 covers the entirety of the back surface 112. Also, the insulating film 51 covers the end surface 211 of the through recess inner surface insulated part 21. The insulating film 51 is formed, for example, by laminating insulating material(s). The insulating film 51 is formed, for example, by CVD (Chemical Vapor Deposition). The insulating film 51 comprises polyimide resin or benzocyclobutene resin. The insulating film 51 is equivalent to the first insulating film defined in the present disclosure.

The insulating film 52 is formed under the back surface 112. The insulating film 52 is formed under the entirety of the back surface 112 excluding a portion of the conductive layer 3 (the backside pad 34). In this way, the conductive layer 3 is between the insulating film 51 and the insulating film 52. The insulating film 52 comprises, for example, the polyimide resin or benzocyclobutene resin. The insulating film 52 is formed by, for example, CVD. The insulating film 52 is equivalent to the second insulating film defined in the present disclosure.

The backside electrode pad 61 is formed under the back surface 112. The backside electrode pad 61 is connected with the conductive layer 3 and electrically connected with the electronic component 8. The backside electrode pad 61 is formed in a structure of a laminated layer, which comprises, for example, in the order from near to far from the substrate 1, Ni layer, Pd layer, and Au layer. In this embodiment, the backside electrode pad 61 has a rectangular shape.

The sealing resin portion 7 is filled in the recess for disposing the component 14, and covers the electronic component 8. The sealing resin portion 7 covers the electronic component 8, and is filled in the space surrounded by the bottom surface 142 and the lateral surface 141. In this embodiment, the sealing resin portion 7 is also filled in the space of the through recess 17 that is connected with the recess for disposing the component 14 in which no metal-filled portion 4 exists. Regarding the materials suitable for use as the sealing resin portion 7, illustrative examples of which include, for example, epoxy resins, phenolic resins, polyimide resins, polybenzoxazole (PBO) resins, and silicone resins. The sealing resin portion 7 may be a translucent resin or non-translucent resin; in this embodiment, the opaque resin is preferred.

The electronic component 8 is disposed over the recess for disposing the component 14. The electronic component 8 is mounted on the plurality of bonding pads 33 via the solder 81. As an example of the electronic component 8, for example, it can be an integrated circuit device, specifically an ASIC (Application Specific Integrated Circuit) device. Alternatively, as another example of the electronic component 8, it can be a passive device such as an inductor or capacitor, or the like.

Next, one example of the method for manufacturing the electronic device A1 is discussed with reference to FIGS. 4 through 16.

Figure 4:
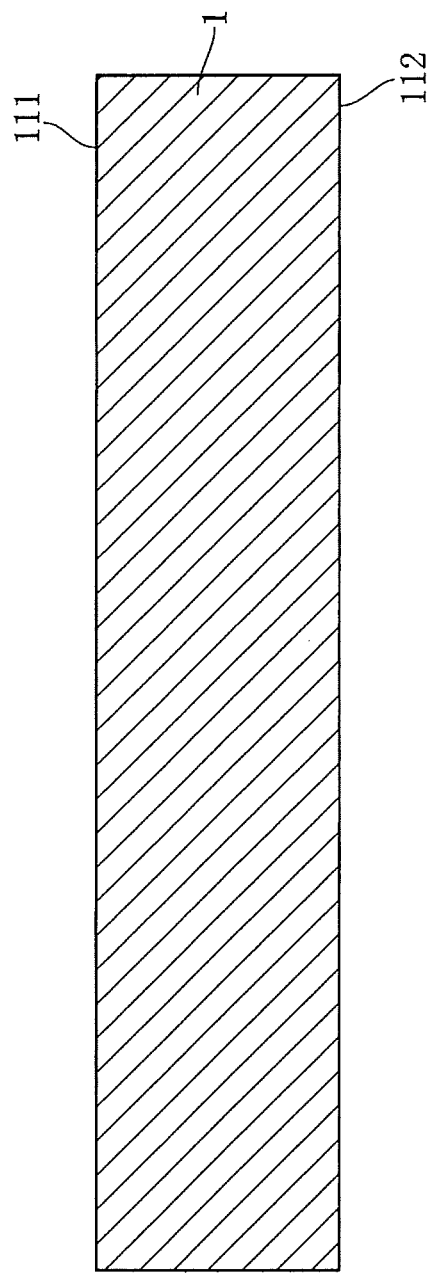
FIG. 4 is a sectional view illustrating the main portion of the electronic device of FIG. 1 under one step of the method for preparing the same.

First, the substrate 1 illustrated in FIG. 4 is prepared. The substrate 1 comprises monocrystalline of a semiconductor material; in this embodiment, from monocrystalline silicon. The thickness of the substrate 1 is, for example, about 250 to 600 µm. The substrate 1 has a size that is suitable for obtaining a plurality of the electronic devices A1. That is, in the following manufacturing steps, the method is provided under the premise that a plurality of electronic devices A1 are collectively manufactured. Although it is also feasible to use a method that manufactures one electronic device A1, when considering the industrial efficiency, it is more practical to use the method for manufacturing a plurality of electronic devices A1 collectively. Further, strictly speaking, the substrate 1 of FIG. 4 is different from the substrate 1 of the electronic device A1; however, to facilitate the understanding of the present disclosure, each substrate is referred to as the substrate 1.

The substrate 1 comprises a main surface 111 and a back surface 112 facing opposite sides with each other. In this embodiment, the plane having the crystal orientation of (100), i.e., the (100) plane, is used as the main surface 111.

Next, a mask layer comprising $SiO_2$ is formed by, for example, oxidizing the main surface 111. The thickness of the mask layer is, for example, about 0.7 to 1.0 µm.

Next, the mask layer is patterned by, for example, etching. In this way, openings having, for example, a rectangular shape, are formed at the mask layer. The shape and dimension of the opening depends on the desired shape and dimension of the resultant recess 14 for disposing the component.

Figure 5:
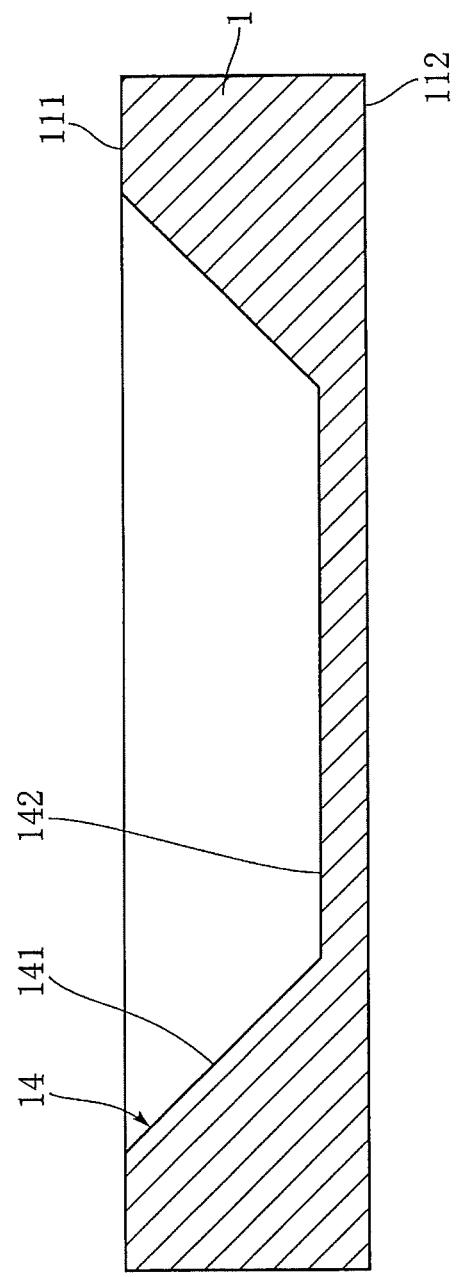
FIG. 5 is a sectional view illustrating the main portion of the electronic device of FIG. 1 under one step of the method for preparing the same.

Next, as illustrated in FIG. 5, the recess for disposing the component 14 is formed. The recess for disposing the component 14 is formed by, for example, performing the anisotropic etching to the substrate 1 using KOH. KOH is one example of the alkaline etching solutions that may achieve a good anisotropic etching of monocrystalline silicon. In this way, the recess for disposing the component 14 is formed in the substrate 1. The recess for disposing the component 14 comprises a lateral surface 141 and a bottom surface 142, and is recessed from the main surface 111. The recess for disposing the component 14, when viewed in the thickness direction, has a rectangular shape. The bottom surface 142 is at a right angle with respect to the thickness direction. The lateral surface 141 forms an included angle of about 55° with respect to the plane orthogonal to the thickness direction.

Next, a mask layer comprising $SiO_2$ is formed by, for example, oxidizing the lateral surface 141 and the bottom surface 142. Next, the mask layer is patterned by, for example, etching. In this way, openings having, for example, a rectangular shape are formed at the mask layer. The shape and dimension of the opening depends on the desired shape and dimension of the resultant through recess 17.

Figure 6:
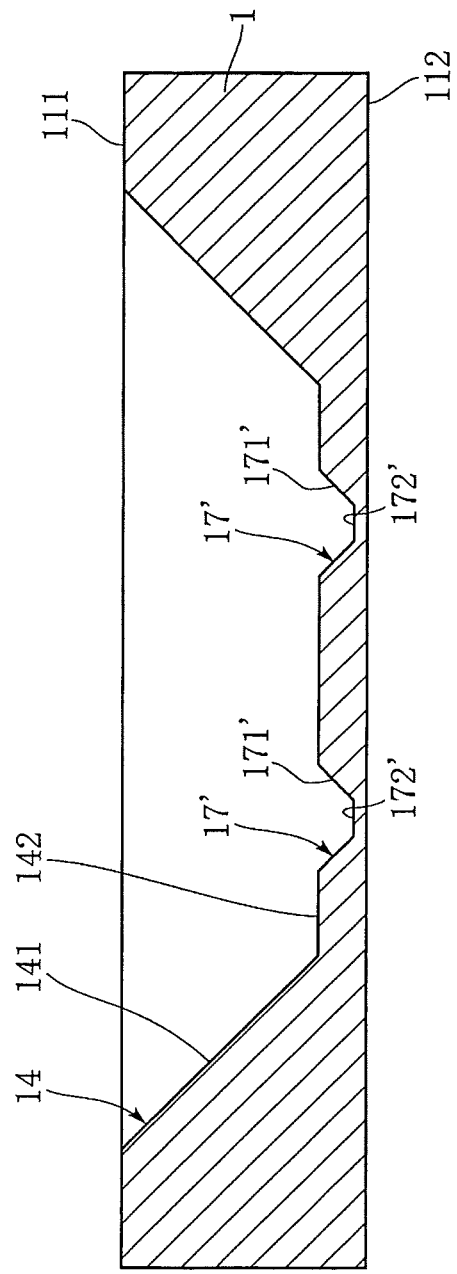
FIG. 6 is a sectional view illustrating the main portion of the electronic device of FIG. 1 under one step of the method for preparing the same.

Next, the recess is formed by anisotropic etching using KOH. Then, the mask layer is removed. By using this two-stage etching, the recess for disposing the component 14 and a recess 17' illustrated in FIG. 6 are formed. The recess 17', which will become a portion of the through recess 17 later, comprises a recess inner surface 171' and a recess bottom surface 172'. The recess 17' is recessed from the recess for disposing the component 14. The recess for disposing the component 14, when viewed in the thickness direction, has a rectangular shape. The recess bottom surface 172' is at a right angle with respect to the thickness direction. The recess inner surface 171' forms an included angle of about 55° with respect to the plane orthogonal to the thickness direction.

Figure 7:
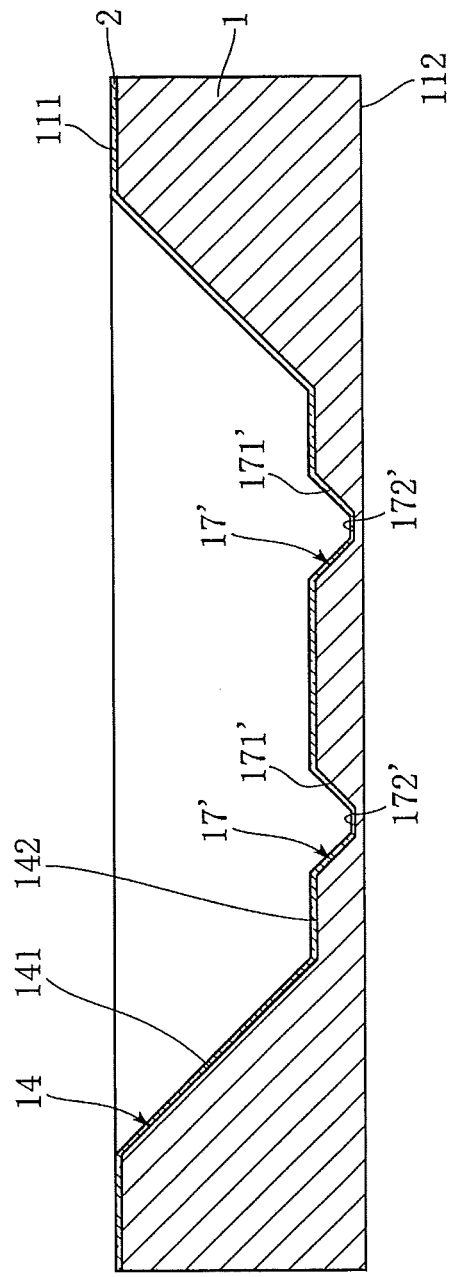
FIG. 7 is a sectional view illustrating the main portion of the electronic device of FIG. 1 under one step of the method for preparing the same.

Next, as illustrated in FIG. 7, by performing a thermal oxidation, the insulating layer 2 is formed on the lateral surface 141, the bottom surface 142, the recess inner surface 171', and the recess bottom surface 172'.

Figure 8:
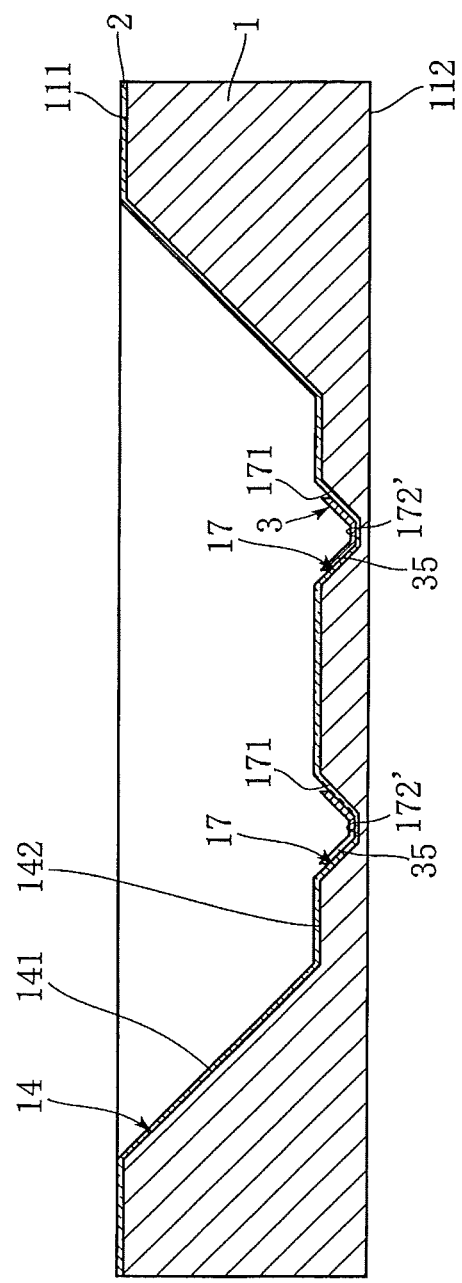
FIG. 8 is a sectional view illustrating the main portion of the electronic device of FIG. 1 under one step of the method for preparing the same.

Next, as illustrated in FIG. 8, the conductive layer 3 (the seed layer 31 and the plating layer 32) is formed. The seed layer 31 is formed by, for example, sputtering Ti or Cu followed by patterning. The plating layer 32 is formed by, for example, performing the electroplating plating using the seed layer 31. As a result, the plating layer 32 comprising layers formed by laminating, for example, Cu or Ti, Ni and Cu, is obtained. The conductive layer 3 is formed by laminating the seed layer 31 and the plating layer 32. In this case, the conductive layer 3 is formed in a shape that comprises, for example, the through recess inner conductive part 35.

Figure 9:
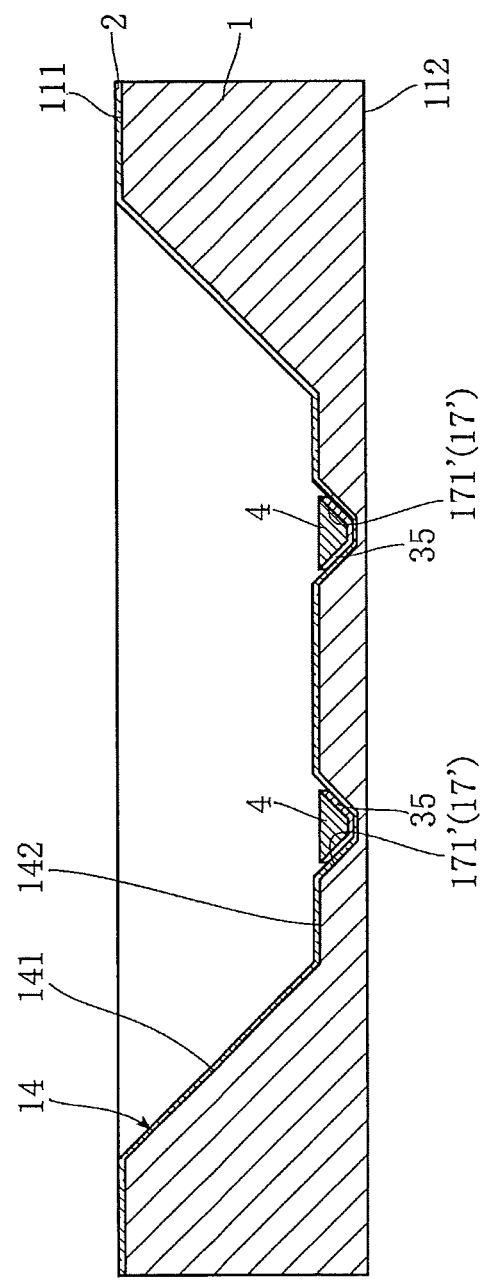
FIG. 9 is a sectional view illustrating the main portion of the electronic device of FIG. 1 under one step of the method for preparing the same.

Next, as illustrated in FIG. 9, the metal-filled portion 4 is formed. The metal-filled portion 4 is formed by, for example, performing the electroplating plating using the conductive layer 3 (through recess inner conductive part 35) formed in the through recess 17. As a result, the metal-filled portion 4 comprising, for example, Cu is formed.

Next, a photoresist layer is formed on the recess for disposing the component 14 and the recess 17'. The photoresist layer is formed by, for example, spray coating a photosensitive photoresist resin.

Next, the photoresist layer is patterned by, for example, etching. In this way, openings are formed in the photoresist layer. The shape and dimension of the opening depends on the shape and dimension of the bonding pads 33. At least a portion of the metal-filled portion 4 is exposed through the opening.

Figure 10:
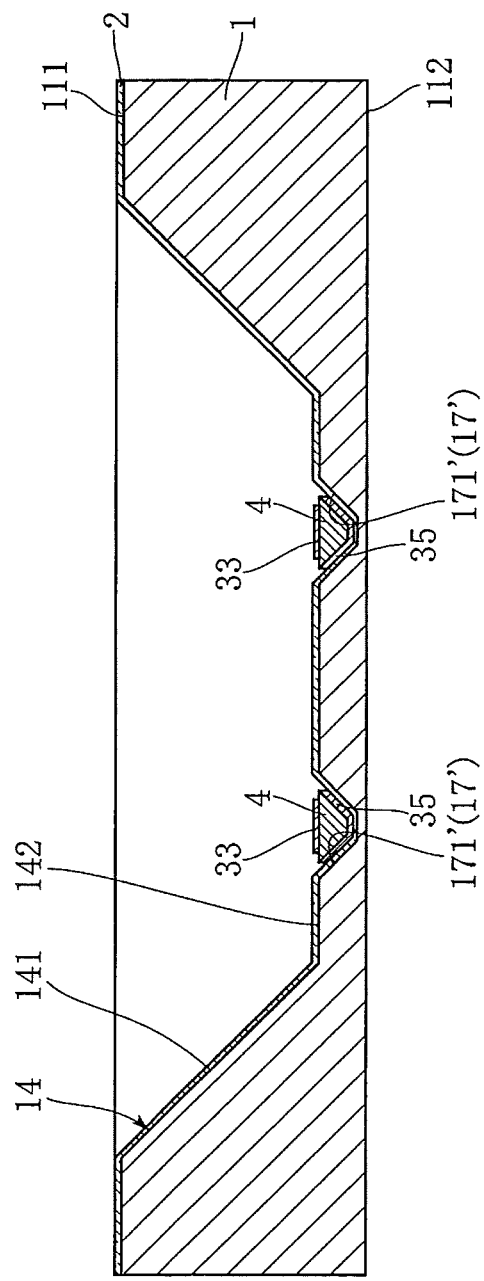
FIG. 10 is a sectional view illustrating the main portion of the electronic device of FIG. 1 under one step of the method for preparing the same.

Next, as illustrated in FIG. 10, the bonding pads 33 are formed. The bonding pads 33 are formed by, for example, performing the electroplating plating using the metal-filled portion 4. As a result, the bonding pads 33 comprising, for example, Cu are obtained.

Figure 11:
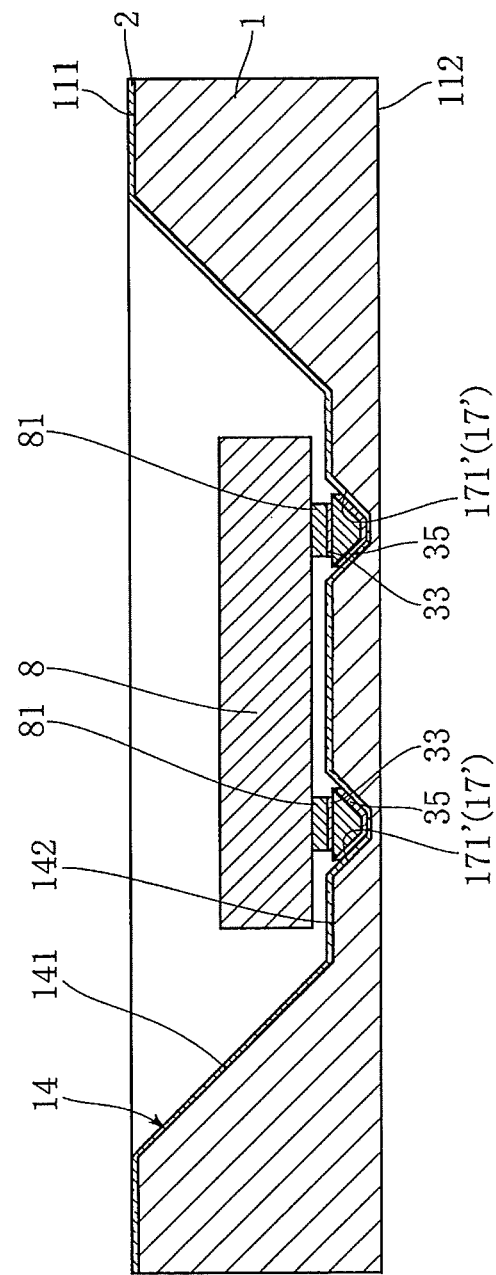
FIG. 11 is a sectional view illustrating the main portion of the electronic device of FIG. 1 under one step of the method for preparing the same.

Next, as illustrated in FIG. 11, the electronic component 8 is disposed over the recess for disposing the component 14. For example, a solder ball is pre-formed on the electronic component 8. The solder ball is pre-coated with a flux. By using the adhesiveness of the flux, the electronic component 8 is installed. Also, the solder ball is melted and then hardened by using a reflow oven; in this way, the disposition of the electronic component 8 is accomplished using the solder 81. Other than the method of forming the solder ball, it is also feasible to use the method that a solder paste is pre-coated on the bonding pads 33 of the conductive layer 3.

Further, in the case where no bonding pad 33 is disposed, the step of forming the bonding pads 33 is omitted, and it is feasible to install the electronic component 8 on the metal-filled portion 4 via the solder 81.

Figure 12:
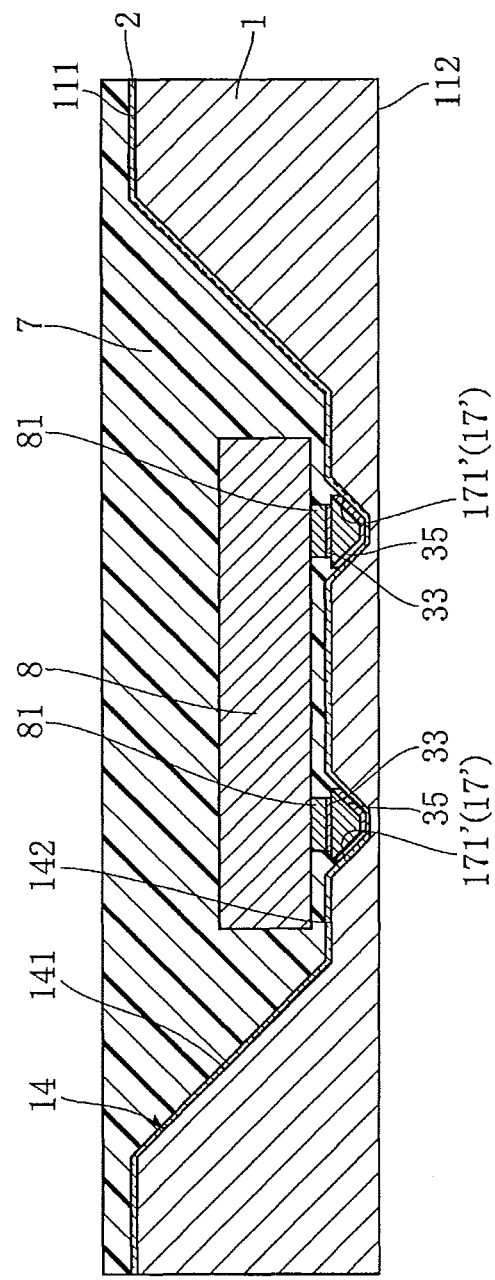
FIG. 12 is a sectional view illustrating the main portion of the electronic device of FIG. 1 under one step of the method for preparing the same.

Next, as illustrated in FIG. 12, the sealing resin portion 7 is formed. The sealing resin portion 7 is formed by, for example, the following steps: filing a resin material so as to cover the electronic component 8 primarily from the bottom surface 142 and the recess 17', and then hardening the resin material, in which the resin material is a material with excellent permeability and hardened by photo-radiation.

Figure 13:
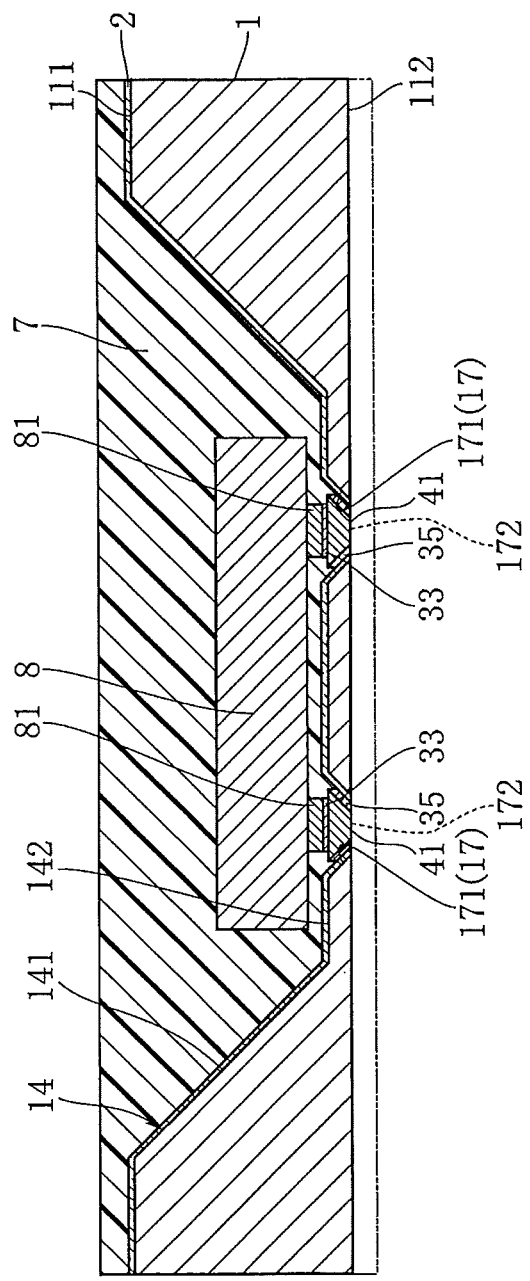
FIG. 13 is a sectional view illustrating the main portion of the electronic device of FIG. 1 under one step of the method for preparing the same.

Next, as illustrated in FIG. 13, the substrate 1 is grinded from the back surface 112. The back surface 112 is grinded until it reaches the metal-filled portion 4. In this way, the bottom (end surface 41) of the metal-filled portion 4 is exposed. Also, by grinding the portion of the bottom surface, the recess 17' becomes the through recess 17 that comprises a flat opening 172 at the bottom thereof. In this case, the end surface 41 of the metal-filled portion 4, which is exposed by grinding and the back surface 112 of the substrate 1 are coplanar. Also, the metal-filled portion 4 blocks the entirety of the opening 172 of the through recess 17.

Figure 14:
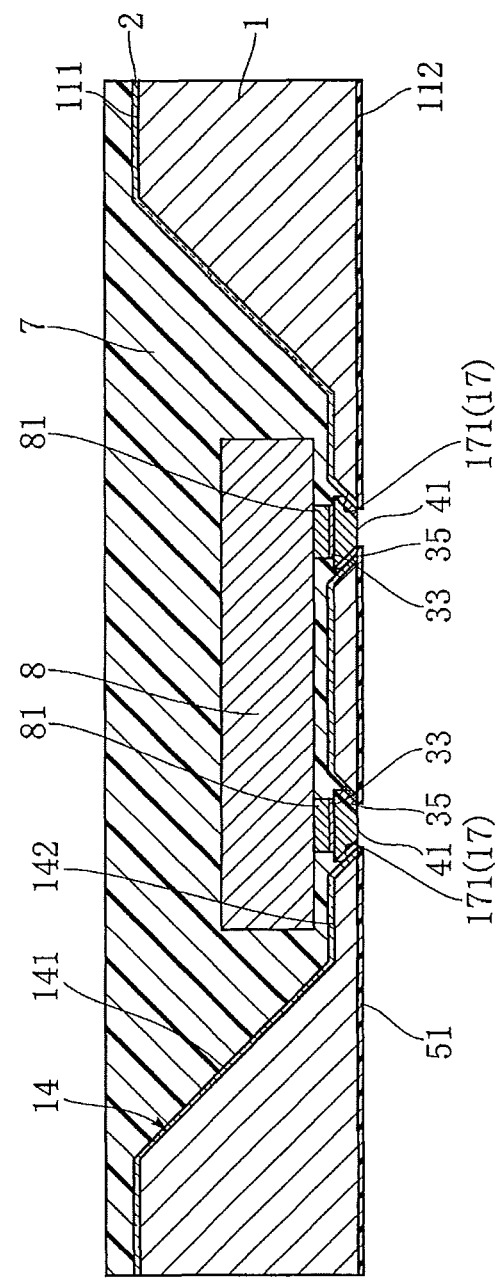
FIG. 14 is a sectional view illustrating the main portion of the electronic device of FIG. 1 under one step of the method for preparing the same.

Next, as illustrated in FIG. 14, the insulating film 51 is formed under the back surface 112. For example, the insulating film 51 is formed by laminating insulating materials such as polyimide resin or benzocyclobutene resin using CVD and then patterning the same.

Figure 15:
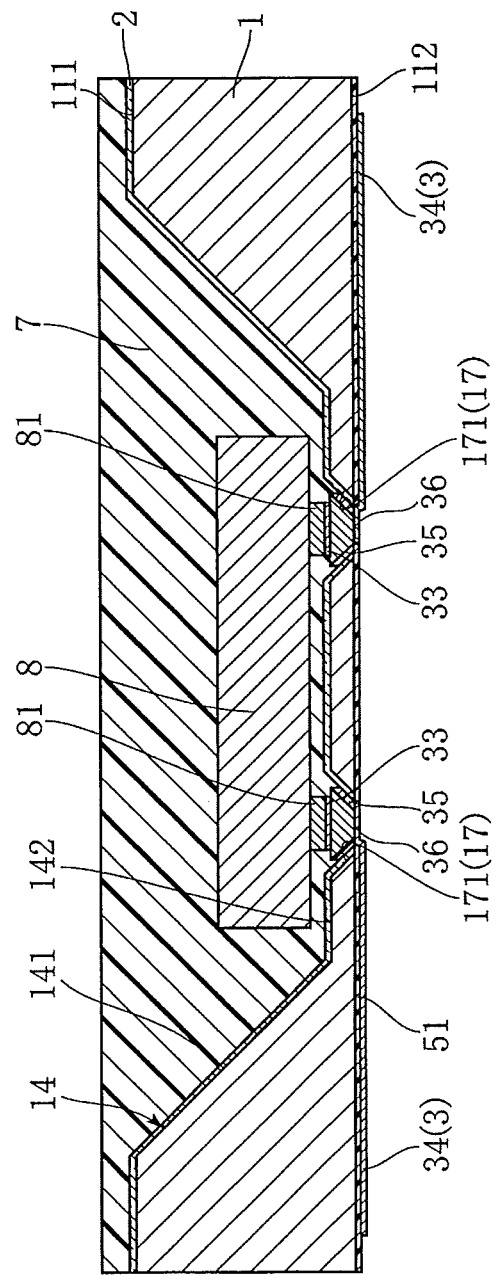
FIG. 15 is a sectional view illustrating the main portion of the electronic device of FIG. 1 under one step of the method for preparing the same.

Next, as illustrated in FIG. 15, the conductive layer 3 (the backside pad 34 and the covering portion 36) is formed at appropriate positions at the back surface 112 (on the insulating film 51 and on the metal-filled portion 4). The seed layer 31 is formed by, for example, sputtering Ti or Cu followed by patterning. The plating layer 32 is formed by, for example, performing the electroplating plating using the seed layer 31. As a result, the plating layer 32 comprising layers formed by laminating, for example, Cu or Ti, Ni and Cu, is obtained. The conductive layer 3 is formed by laminating the seed layer 31 and the plating layer 32 layers. In this case, the conductive layer 3 is formed in a shape that comprises, for example, the backside pad 34 and the covering portion 36.

Figure 16:
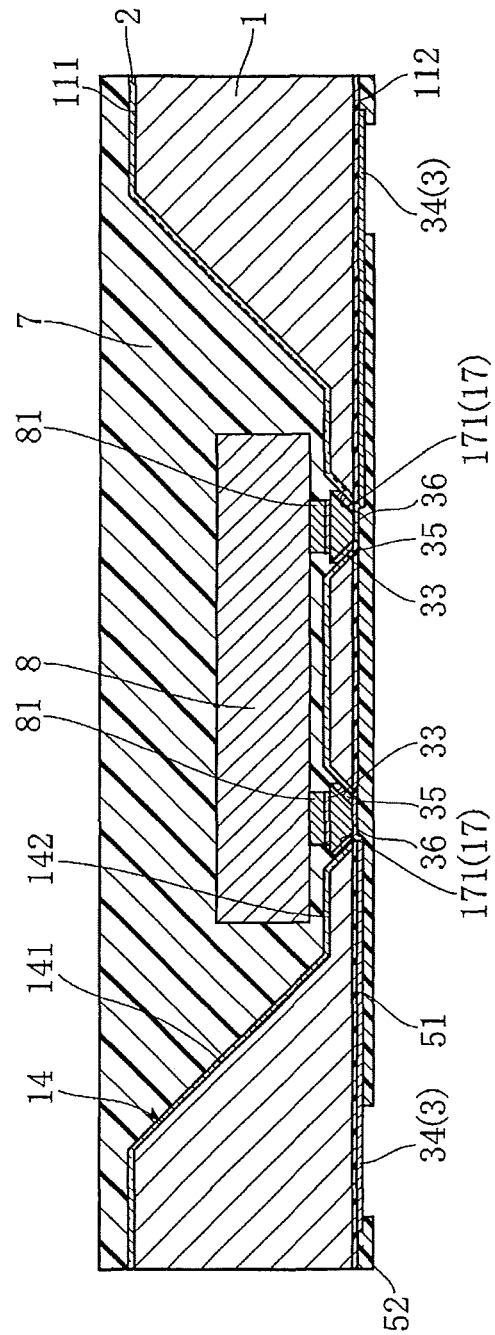
FIG. 16 is a sectional view illustrating the main portion of the electronic device of FIG. 1 under one step of the method for preparing the same.

Next, as illustrated in FIG. 16, the insulating film 52 is formed. The insulating film 52 is formed at appropriate positions of the back surface 112 (on the conductive layer 3 and on the insulating film 51). For example, the insulating film 52 is formed by laminating layers of insulating materials such as polyimide resin or benzocyclobutene resin by CVD followed by patterning. After forming the insulating film 52, the backside pad 34 is not covered by the insulating film 52 and hence is exposed. Thereafter, the backside electrode pad 61 is formed. By electroless plating metals such as, Ni, Pd, Au, or the like, the backside electrode pad 61 is formed on the backside pad 34 (the exposed portion of the conductive layer 3).

Then, to obtain the electronic device A1 illustrated in FIG. 1 and FIG. 2, for example, a dicer is used to cut the substrate 1.

The function of the electronic device A1 is discussed below.

According to the present embodiment, the through recess 17 that penetrates from the recess for disposing the component 14 to the back surface 112 is formed in the substrate 1. The conductive layer 3 extends at least from the through recess 17 to the back surface 112. According to this configuration, a current path from the recess for disposing the component 14 side to the back surface 112 side is formed. In this way, a configuration is achieved by allowing the conductive path required for the operation of the electronic component 8, for example, to overlap with the electronic component 8, when viewed in the thickness direction. Therefore, it is capable of miniaturizing the dimension of the electronic device A1, when viewed in the thickness direction.

In this embodiment, the metal-filled portion 4 is deposed in the through recess 17. The metal-filled portion 4 blocks the bottom of the through recess 17. Accordingly, the openings at the side of the back surface 112 of the through recess 17 are blocked by the metal-filled portion 4. According to this configuration, it is feasible to prevent the decrease in strength of the substrate 1 due to the formation of the through recess 17.

In this embodiment, the metal-filled portion 4 covers the through recess inner conductive part 35, and is connected with the through recess inner conductive part 35. The bottom of the through recess 17 is designed to face the flat surface of the opening in the thickness direction of the substrate 1, and the metal-filled portion 4 blocks the entirety of the flat opening. Also, the metal-filled portion 4 comprises an end surface 41 that faces the same direction as the back surface 112. The end surface 41 and the back surface 112 are coplanar. In this way, the conductive layer 3 formed on the back surface 112 side is configured to comprise a portion (the covering portion 36) that covers the end surface 41. Moreover, the end surface 41 of the metal-filled portion 4 is connected with the covering portion 36. The contact is formed in an area that is equivalent to the area of the opening at the bottom of the through recess 17. Therefore, the covering portion 36 and the through recess inner conductive part 35 are configured to be electrically connected; that is, it is feasible to accurately conduct the portion of the conductive layer 3 formed at the back surface 112 side and the portion of the conductive layer 3 formed at the through recess 17.

The insulating film 51 is formed on the back surface 112 by laminating layers of insulating materials. As compared with the cases where an insulating film is formed by, for example the thermal oxidation of the substrate 1, the present embodiment of forming the insulating film 51 by laminating layers can form the insulating film 51 at a lower temperature. In this way, during the manufacture of the electronic device A1, undesired conditions caused by thermal oxidation, such as the melting of the sealing resin portion 7 or the oxidation of the metal-filled portion 4 or the like, can be avoided. The condition of the present embodiment is preferably used for the manufacture of the electronic device A1.

In this embodiment, the bonding pad 33, when viewed in the thickness direction of the substrate 1, locates at a position that overlaps with the through recess 17. In this way, when disposing the electronic component 8, the solder 81 bonded at the bonding pad 33 is located in the space above the metal-filled portion 4 in the through recess 17 (the space recessed from the recess for disposing the component 14). According to this configuration, the solder 81 can be formed easily.

Figure 17:
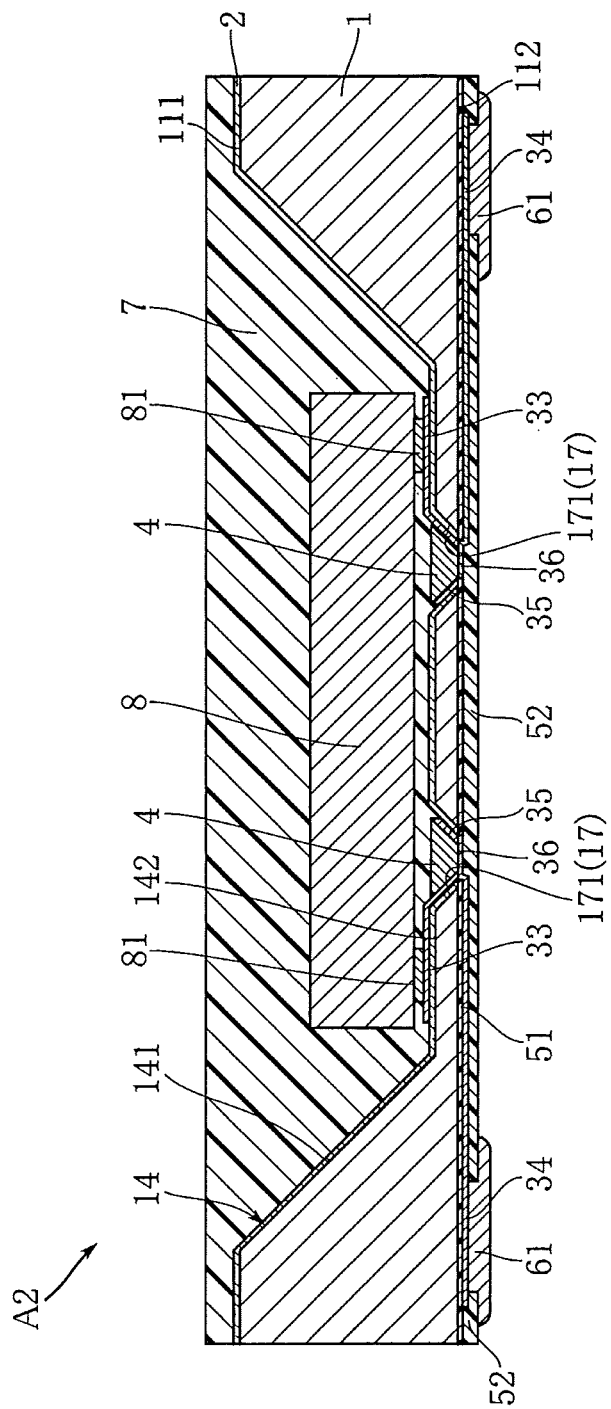
FIG. 17 is a sectional view illustrating an electronic device according to a second embodiment of the present disclosure.

FIG. 17 illustrates the electronic device according to the second embodiment of the present disclosure. The electronic device A2 of the present embodiment is different from the above-mentioned embodiment primarily in the configuration of the conductive layer 3 that is formed on the recess for disposing the component 14 to the through recess 17.

In this embodiment, as illustrated in FIG. 17, the conductive layer 3 extends from the recess for disposing the component 14 via the through recess 17 to the back surface 112. More specifically, the conductive layer 3 formed over the through recess 17 (the through recess inner conductive part 35) extends continuously to the bottom surface 142 of the recess for disposing the component 14. The bonding pad 33 is formed over the bottom surface 142. The through recess inner conductive part 35 is electrically connected with the bonding pad 33 formed over the bottom surface 142 and with the backside pad 34 formed under the back surface 112. The bonding pad 33, when viewed in the thickness direction of the substrate 1, is located at a position that does not overlap with the through recess 17. The electronic component 8 is mounted on the bottom surface 142 via the bonding pad 33.

According to this embodiment, it is also capable of achieving the miniaturization of the electronic device A2. Also, the bonding pad 33 is formed over the bottom surface 142, and is located at a position that, when viewed in the thickness direction of the substrate 1, does not overlap with the through recess 17. According to this configuration, it is feasible to improve the freedom of the disposition of the electronic component 8 mounted by using the bonding pad 33.

The electronic device of the present disclosure is not limited to the above-mentioned embodiments. The design specific configurations of various parts of the electronic device of the present disclosure can be freely modified in various ways.

What is claimed is:

1. An electronic device, comprising:
    a substrate, having a main surface and a back surface facing opposite sides with each other in a thickness direction, wherein the substrate comprises a semiconductor material;
    an electronic component, disposed over the substrate; and
    a conductive layer, electrically connected with the electronic component; wherein:
    a recess for disposing the component and a plurality of through recesses are formed in the substrate, wherein the recess for disposing the component is recessed from the main surface of the substrate to a bottom surface of the recess for disposing the component, and the plurality of through recesses have a width gradually reduced from the bottom surface of the recess for disposing the component-to the back surface of the substrate,
    the electronic component is disposed over the recess for disposing the component,
    a metal-filled portion is formed in each of the plurality of through recesses, wherein the metal-filled portion blocks at least a bottom of one of the plurality of through recesses and is filled with a metal material,
    the conductive layer is formed at least from the through recess to the back surface, and wherein the conductive layer comprises:
    a plurality of bonding pads, configured to dispose the electronic component; a plurality of backside pads, formed at the back surface side; and a plurality of through recess inner conductive parts, for respectively electrically connecting the plurality of bonding pads and the plurality of backside pads, and respectively formed within the plurality of through recesses.

2. The electronic device of claim 1, wherein the through recess comprises an opening at the bottom, wherein the opening is flat and faces the thickness direction, and the metal-filled portion blocks the entirety of the opening.

3. The electronic device of claim 1, wherein a dimension of the metal-filled portion in the thickness direction is greater than the thickness of the conductive layer.

4. The electronic device of claim 1, further comprising a first insulating film formed under the back surface of the substrate, and
    the first insulating film is between the substrate and the conductive layer.

5. The electronic device of claim 1, wherein a cross-sectional dimension of the recess for disposing the component decreases from the main surface side toward the bottom surface of the recess for disposing the component.

6. The electronic device of claim 1, wherein the recess for disposing the component has the bottom surface facing a first thickness direction, which is one side of the thickness direction, and
    the electronic component is disposed over the bottom surface of the recess for disposing the component.

7. The electronic device of claim 1, wherein the conductive layer comprises a seed layer and a plating layer, wherein the seed layer is between the substrate and the plating layer.

8. The electronic device of claim 1, further comprising a sealing resin portion filled in the recess for disposing the component and covering the electronic component.

9. The electronic device of claim 1, wherein each of the plurality of bonding pads, when viewed in the thickness direction, has at least a portion thereof overlapping with any one of the plurality of the through recesses.

10. The electronic device of claim 1, wherein the conductive layer is formed from the recess for disposing the component via the through recess to the back surface.

11. The electronic device of claim 1, wherein the bonding pads are formed over the recess for disposing the component.

12. The electronic device of claim 2, wherein the metal-filled portion comprises an end surface facing the same direction as the back surface, and the end surface is coplanar with the back surface.

13. The electronic device of claim 4, wherein the first insulating film is formed by laminating insulating materials.

14. The electronic device of claim 4, further comprising a second insulating film formed under the back surface, and the conductive layer is between the first insulating film and the second insulating film.

15. The electronic device of claim 6, wherein the bottom surface of the recess for disposing the component is a plane orthogonal to the thickness direction.

16. The electronic device of claim 12, wherein the conductive layer comprises a covering portion that covers the end surface of the metal-filled portion.

17. The electronic device of claim 13, wherein the first insulating film comprises a polyimide resin or a benzocyclobutene resin.

18. The electronic device of claim 14, further comprising a backside electrode pad formed under the back surface, and the backside electrode pad is connected with the conductive layer and electrically connected with the electronic component.

19. An electronic device, comprising:

a substrate, having a main surface and a back surface facing opposite sides with each other in a thickness direction, wherein the substrate comprises a semiconductor material;

an electronic component, disposed over the substrate; and a conductive layer, electrically connected with the electronic component; wherein, a recess for disposing the component and a through recess are formed in the substrate, wherein the recess for disposing the component is recessed from the main surface, and the through recess penetrates from the recess for disposing the component to the back surface;

the electronic component is disposed over the recess for disposing the component;

a metal-filled portion is formed in the through recess, wherein the metal-filled portion blocks at least a bottom of the through recess and is filled with a metal material;

the conductive layer is formed at least from the through recess to the back surface;

wherein the number of the through recess is plural;

wherein the conductive layer comprises:

a plurality of bonding pads, configured to dispose the electronic component; a plurality of backside pads, formed at the back surface side; and a plurality of through recess inner conductive part, for respectively electrically connecting the plurality of bonding pads and the plurality of backside pads, and respectively formed within a plurality of the through recess.

20. The electronic device of claim 19, wherein each of the plurality of bonding pads, when viewed in the thickness direction, has at least a portion thereof overlapping with any one of the plurality of the through recesses.

21. The electronic device of claim 19, wherein the conductive layer is formed from the recess for disposing the component via the through recess to the back surface.

22. The electronic device of claim 21, wherein the bonding pads are formed over the recess for disposing the component.

* * * * *